United States Patent
Zrilic (10) Patent No.: US 10,498,354 B1
(45) Date of Patent: Dec. 3, 2019

(54) AMPLITUDE MODULATION SYSTEM AND APPARATUS

(71) Applicant: Djuro George Zrilic, Santa Fe, NM (US)

(72) Inventor: Djuro George Zrilic, Santa Fe, NM (US)

(73) Assignee: Djuro G. Zrilic, Santa Fe, NM (US)

( * ) Notice: Subject to any disclaimer, the term of this patent is extended or adjusted under 35 U.S.C. 154(b) by 0 days.

(21) Appl. No.: 16/501,168

(22) Filed: Mar. 4, 2019

(51) Int. Cl.
*H03M 3/00* (2006.01)

(52) U.S. Cl.
CPC ................................ *H03M 3/438* (2013.01)

(58) Field of Classification Search
CPC .............................. H03M 3/438; H03M 3/30
USPC ................................ 341/143, 155; 375/295
See application file for complete search history.

(56) References Cited

U.S. PATENT DOCUMENTS

| | | | | |
|---|---|---|---|---|
| 6,888,905 B1* | 5/2005 | Cheah | ................... | H04L 7/0331 375/355 |
| 7,554,474 B2* | 6/2009 | Le Guillou | ............ | H03M 3/30 341/143 |
| 8,755,461 B2* | 6/2014 | Shim | ................... | H04L 27/2032 375/316 |
| 9,141,339 B2 | 9/2015 | Zrilic | | |
| 9,525,430 B1 | 12/2016 | Zrilic | | |
| 9,575,729 B1 | 2/2017 | Zrilic | | |

OTHER PUBLICATIONS

Stauh, J. et al. "Pulse-Density Modulation for RF Application: The Radio-Frequency Power Amplifier (RF-PA) as a Power Converter ", US Berkeley, CA, pp. 3563-3568 (Year: 2008).*
H. Taub, D. Schilling, Principles of Communication System, Second Edition, 1986, Mc. Graw Hill Inc. ISBN: 0-07-062955-2, 3 pages.
W. Tomasi, Advanced Electronics Communication Systems, Sixth Edition, 2004, Pearson-Prentice Hall, ISBN 0-13-045350-1, 3 pages.
C. Zierhoferm Frequency Modulation and First-Order Delta Sigma Modulation: Signal Representation with Unity Weight Dirac Impulses, IEEE Signal Processing Letters, vol. 15, 2008, pp, 825-828.
S. Pavan, R. Schrier, G. Temes, Understanding Delta-Sigma Data Converter, Second Edition, IEEE Press, Wiley, 2017, ISBN: 978-1-119-25827-8, 3 pages.

(Continued)

*Primary Examiner* — Khai M Nguyen (57) ABSTRACT

Disclosed is the delta-sigma amplitude modulation system. Operation of amplitude modulator is based on the use of the second-order delta-sigma modulator. Polar delta-sigma bit-stream is nonlinearly processed in the negative feedback of delta-sigma modulator to produce an amplitude modulated signal. All information about modulating signal is contained in both envelope and carrier of the modulated signal. Thus, because of a dual nature of modulated signal, one can detect zero-crossings of a carrier, using sign detector, to obtain a polar delta-sigma bit stream. By demodulation (low-pass filtering) this polar bit-stream modulating signal is obtained. The main advantages of a proposed system are: simple digital amplitude modulator and simple demodulator which can be integrated in one IC chip. Because of non-positional nature of delta-sigma bit stream, proposed system is robust to channel errors.

1 Claim, 15 Drawing Sheets

(56) References Cited

OTHER PUBLICATIONS

J. Candy, G. Temes, Oversampling Delta-Sigma Data Converters, IEEE Press, 1992, ISBN: 0-87942-285-8, 2 pages.
B. Boser, B. Wooley, The Design of Sigma-Delta Modulation Analog-to-Digital Converters, IEEE Journal Solid-State Circuits, vol. SC-23, pp. 1298-1308, Dec. 1988, pp. 293-303
H. Taub, D. Schilling, Principles of Communication System, Second Edition, 1986, Mc. Graw Hill Inc. ISBN: 0-07-062955-2.
W. Tomasi, Advanced Electronics Communication Systems, Sixth Edition, 2004, Pearson-Prentice Hall, ISBN, 0-13-045350-1
J. Stauh, S. Sanders, Pulse-Density Modulation for RF Applications: The Radio-Frequency Power Amplifier (RF PA) as a Power Converter, US Berkeley, CA, 2008.
C. Zierhofer, Frequency Modulation and First-Order Delta Sigma Modulation: Signal Representation with Unity Weight Dirac Impulses, IEEE Signal Processing Letters, vol. 15, 2008, pp. 825-828.
S. Pavan, R. Schrier, G. Temes, Understanding Delta-Sigma Data Converter, Second Edition, IEEE Press, Wiley, 2017, ISBN: 978-1-119-25827-8.
J. Candy, G. Temes, Oversampling Delta-Sigma Data Converters, IEEE Press, 1992, ISBN: 0-87942-285-8.
B. Boser, B. Wooley, The Design of Sigma-Delta Modulation Analog-to-Digital Converters, IEEE Journal Solid-State Circuits, vol. SC-23, pp. 1298-1308, Dec. 1988.
Dj. Zrilic, G. Petrovic, W. Tang, IEEE Tr. on Circuits and Systems-II: Express Briefs. vol. 64. No. 10. Oct. 2017, pp. 1242-1246.

* cited by examiner

AMPLITUDE MODULATION SYSTEM AND APPARATUS

CROSS REFERENCES TO RELATED APPLICATIONS

Dj. Zrilc, U.S. Pat. No. 9,141,339 B2, Date of Patent: Sep. 22, 2015
Dj. Zrilic, U.S. Pat. No. 9,525,430 B1, Date of Patent: Dec. 20, 2016
Dj. Zrilic, U.S. Pat. No. 9,575,729 B1, Date of Patent: Feb. 21, 2017
J. Cheah at al., U.S. Pat. No. 6,888,905 B1, Date of Patent: May 3, 2005
Y. Guillon, U.S. Pat. No. 7,554,474 B2, Date of Patent: Jun. 30, 2009
W. Shim, U.S. Pat. No. 8,755,461 B2, Date of Patent: Jun. 17, 2014

STATEMENT REGARDING FEDERALLY SPONSORED R&D

These research results are not sponsored by Government grants.

NAME OF PARTIES TO A JOINT RESEARCH AGREEMENT

Individual project of Dr. Djuro G. Zrilic

BACKGROUND OF INVENTION

1. Field of the Invention

The present invention relates to a novel amplitude modulation system based on a delta-sigma modulation ($\Delta$-$\Sigma$M) analog-to-digital conversion (ADC) technique. A low-frequency analog input signal is converted into a high-frequency bit-stream by means of a highly oversampled second-order $\Delta$-$\Sigma$ modulator. This bit-stream is nonlinearly processed in the feedback of a $\Delta$-$\Sigma$ modulator to produce an amplitude modulated high frequency signal. Thus, the field of this invention relates to non-conventional signal processing in the area of digital communications.

DESCRIPTION OF THE PRIOR ART

Amplitude modulation (AM) is a very well understood and developed signal processing technique. AM was the earliest modulation method used to transmit voice by radio. It was developed during the first quarter of the 20th century. There are numerous publications on this subject including scientific papers, books, patents, and AM devices data sheets. Basic principles of its operation can be found on the Internet or in any communication text book [1], [2], [6], [7]. In addition to the classic analog amplitude modulation there are several digital amplitude modulation techniques. The oldest one is on-off keying (OOK) which dates to the time of Morse telegraph transmission. Still today, many wireless sensors working at 433 MHz use OOK. Over the years various modulation techniques have been developed such as pulse amplitude modulation (PAM), m-ary PAM, amplitude shift keying (ASK) [2], etc. Use of the $\Delta$-$\Sigma$ modulation for RF applications is elaborated in the reference [3]. It is worth mentioning that a $\Delta$-$\Sigma$ modulation is frequently referred to as a pulse density modulation [3], [4], because the density of pulses of a $\Delta$-$\Sigma$ pulse stream is proportional to the amplitude of an input signal. The proposed UC Berkeley RF pulse density system generates an amplitude-modulated waveform with up to 20 MHz envelope bandwidth and demonstrates the validity of this approach for modern communication standards [3].

Chea at al. (U.S. Pat. No. 6,888,905 B1) proposed a complex wireless receiver (in FIG. 2) which a base-band (BB) portion consists of a complex filter (36), discriminator (44, with inputs 38 A and 38 B) and timing recovery unit (46). Block (44), in FIG. 4, consists of a zero-crossing detector, logic gates (60, 58), and a low-pass filter (64). Beside enormous complexity of the BB portion of the proposed receiver (FIG. 2), this receiving system is not suitable for application, when delta-sigma modulator is used as an analog-to-digital converter, in FIG. 4, block (54). Zrilic has shown (U.S. Pat. No. 9,141,339 B2, FIG. 1A, B, C, D, E; and U.S. Pat. No. 9,525,430 B1) that proposed configuration in FIG. 4 performs rectification or squaring operation, depending on the cut-off frequency of low-pass filter (64) [8]. In FIG. 2 of the proposed wireless receiver, in addition to standard configuration of an antenna (26) and low-noise amplifier (28), one can see that the BB portion consists of a poly-phase filter (30) and a local oscillator needed for quaternary demodulation of an I and Q channels.

Guillou (U.S. Pat. No. 7,554,474 B2) proposed a complex wireless receiver apparatus (in FIG. 2) which consists of a standard RF portion (an antenna, 10-LNA and 20-mixer), a delta-sigma modulator (70), a digital processing circuit (80), which is responsible for selection, interferer suppression, noise shaping, digital filtering, and scaling. It is evident that delta-sigma modulator is employed at intermediate frequency (IF), and a complex post-processing is required, as depicted in box (80) and described in column 6, line 50.

Referring to FIG. 6 of Shim at al. (U.S. Pat. No. 8,755,461 B2) the proposed local wireless signal receiving apparatus uses digital RF processing technology. This technology includes a receiving digital RF processor (box 50), a complex structure of zero-crossing detector (box 60), and a receiving signal processor (box 70). In addition, transmitting apparatus consists of a digital RF processing technology, which comprises phase converter converting QPSK signal into MSK phase information. An MSK phase information is modulated through delta sigma modulator in digitally controlled oscillator (32). Polar modulator (31) is controlled by a feedback signal of a time-to-digital convertor (33). In FIG. 1 one can see overwhelming complexity of a proposed transmitter's digital RF processor (box 30).

To overcome the above-mentioned problems, such as complex IF-RF digital processing, use of $\Delta$-$\Sigma$ modulator at the receiver's IF-RF stage, use of local oscillator at the receiver, etc., present application proposes a simple $\Delta$-$\Sigma$ based amplitude modulator (AM) at the transmitter and a simple asynchronous receiver. Implementation of the proposed $\Delta$-$\Sigma$ AM system is based on the dual nature of $\Delta$-$\Sigma$ AM signal, which will be explained in the following sections.

BRIEF SUMMARY OF THE INVENTION

This invention introduces a novel $\Delta$-$\Sigma$ based AM modulator and a novel asynchronous $\Delta$-$\Sigma$ AM demodulator. Operation of the $\Delta$-$\Sigma$ AM modulator is based on the nonlinear signal processing of a $\Delta$-$\Sigma$ bit stream in the negative feedback of a $\Delta$-$\Sigma$M. The asynchronous operation of the $\Delta$-$\Sigma$ AM receiver is based on a sign detector and low-pass filter (LPF) only. The operation of the proposed circuits will be apparent upon consideration of the following detailed description, taken in conjunction with the accompanying drawings. The present invention includes:

1. A system for producing a digital Δ-Σ based amplitude modulation.
2. A system for asynchronous demodulation of Δ-Σ AM signal.

It is a primary objective of the present invention to design a system for the direct generation of an AM signal using the second-order Δ-Σ modulator (Δ-ΣM2).

It is a further objective of the present invention to design a system for asynchronous demodulation of an AM Δ-Σ modulated signal, using a dual nature of a Δ-Σ amplitude modulated signal.

Yet another objective of the present invention is to demonstrate the of the proposed system in the presence of channel noise.

Finally, it is the objective of the present invention to design a system on a chip (SoC) which includes a Δ-ΣM2amplitude modulator and demodulator circuits.

DETAILED DESCRIPTION OF THE INVENTION

Definition

Amplitude modulation is an increase or decrease of the carrier voltage amplitude. The carrier (high-frequency signal) carries the low-frequency message signal (the information). Thus, two signals are needed to implement modulation: one low-frequency signal and one high-frequency signal. Usually the carrier signal is a sine wave. The low frequency signal changes amplitude, frequency or the phase angle of the carrier. In the case of amplitude modulation, the carrier amplitude varies, with all other factors remaining constant. A newly proposed Δ-Σ amplitude modulator uses Δ-Σ bit-stream as a carrier of a low frequency input signal. Thus, low-frequency information (message) is contained in both envelope and the carrier of modulated signal. This is opposite to the classic AM transmission, where information is in the envelope only, and the carrier is used for demodulation purposes only, and it is the main power consumer. Because the envelope of AM signal is prone to different kinds of noises and its synchronous detection is more sophisticated, we propose detection of a carrier, which is Δ-Σ pulse stream, which contains all the information about modulating (input) signal.

The Best Mode of Invention

The block diagram of the circuits with supporting simulation results are presented; herein shall be presented as the best mode contemplated by the inventor.

How to Make the Invention

As can be amply seen from the drawings, every figure presents a novel result. Thus, it is necessary to describe each figure separately.

Figure 1:
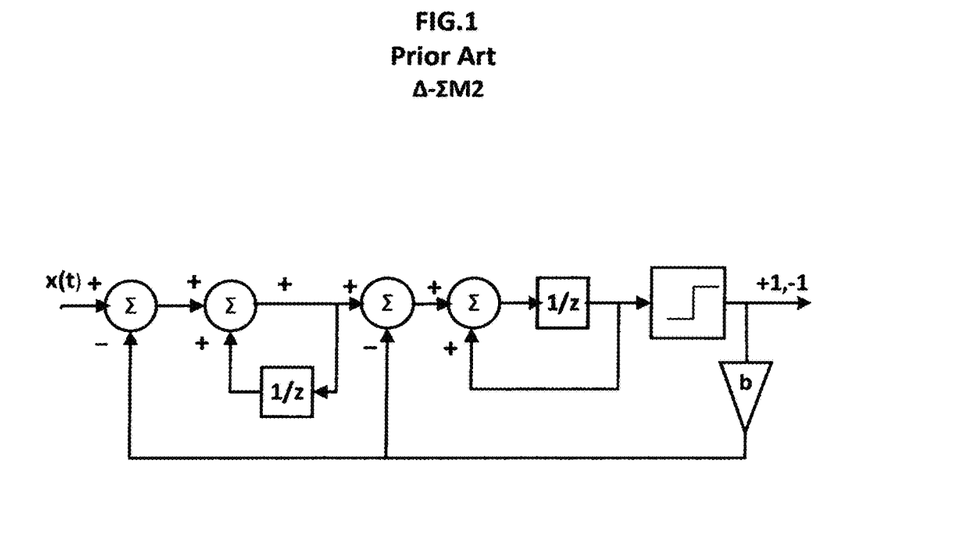
FIG. 1 shows a block diagram of the Δ-ΣM2(Prior Art).

FIG. 1 shows a block diagram of a second-order delta sigma modulator (Δ-ΣM2) used to generate simulation results [5].

Figure 2:
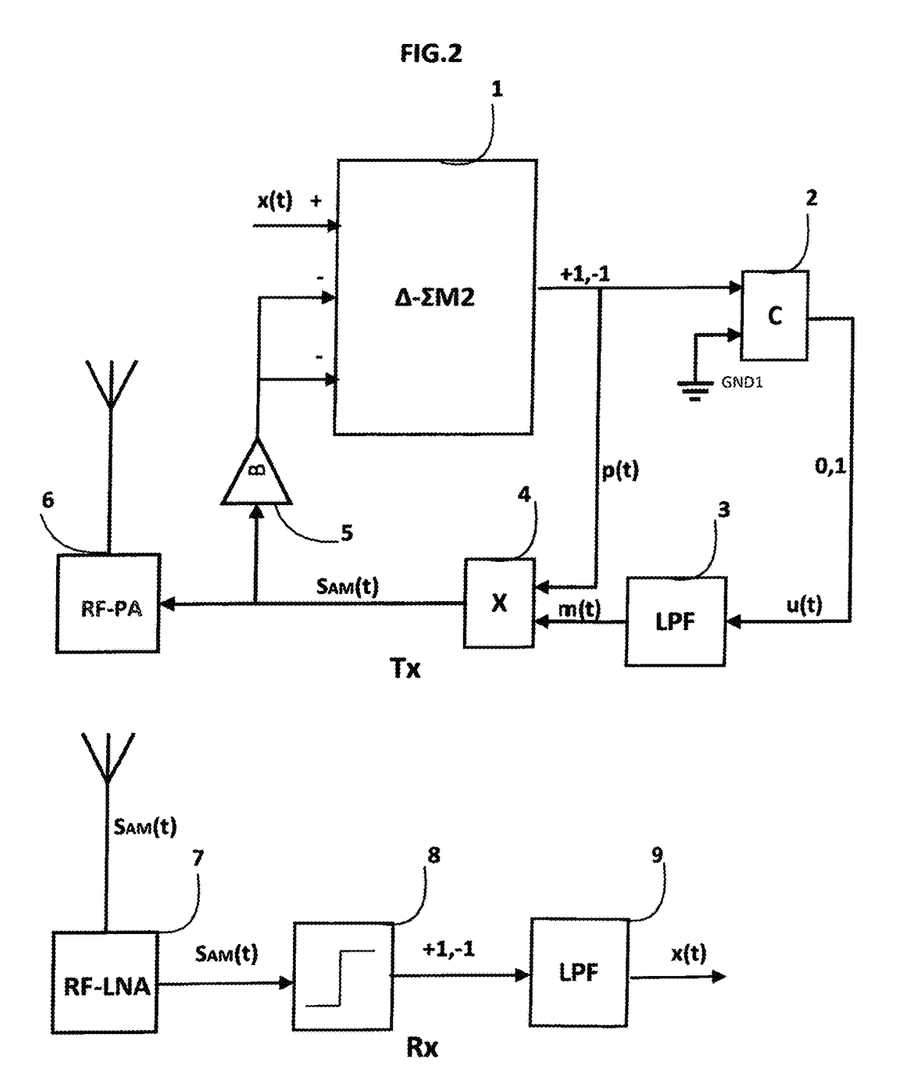
FIG. 2 shows a block diagram of a proposed AM transmitter (Tx) and receiver (Rx).
Figure 3:
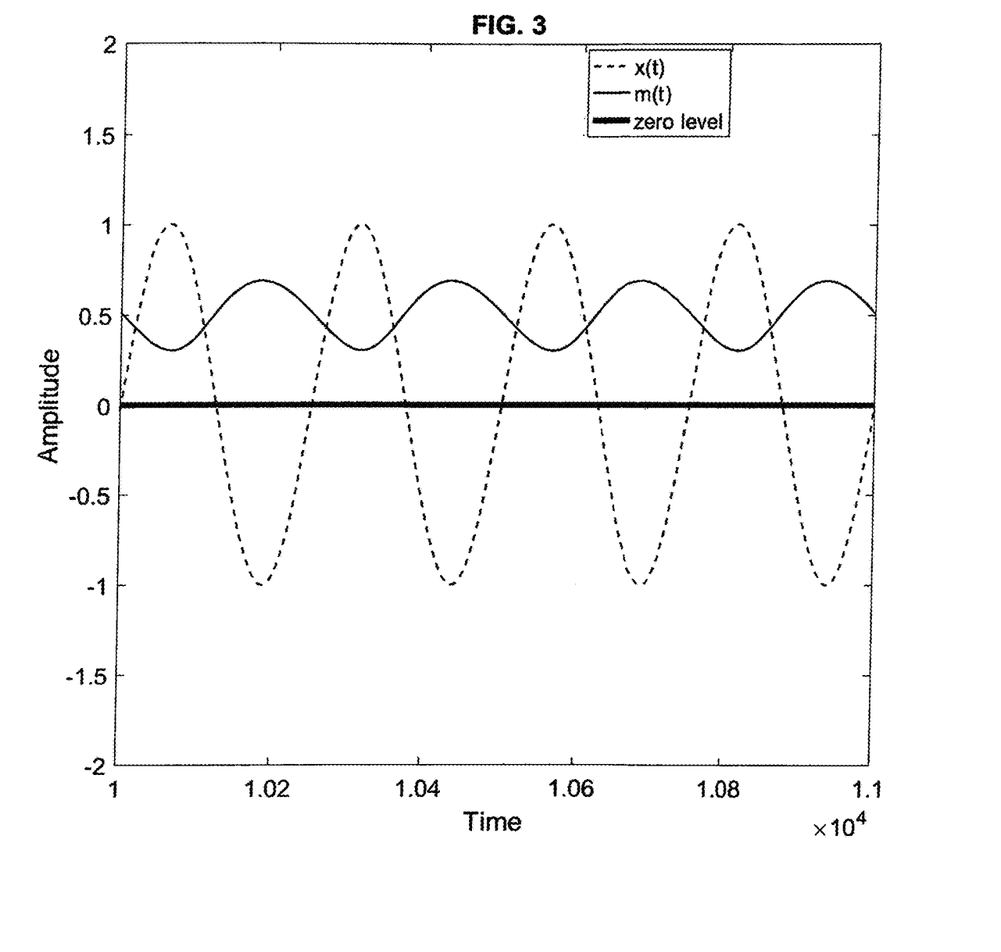
FIG. 3 shows a modulating signal m(t) in a feedback of Δ-ΣM2.

FIG. 2 shows a block diagram of a proposed Δ-ΣM2AM system. Operation of the modulator (transmitter Tx) is as follows. The low-frequency analog input signal x(t) is converted into a one-bit polar bit-stream by Δ-ΣM2(shown in FIG. 1). The output polar bit-stream (+, −1) of Δ-ΣM2(1), in FIG. 2, is converted into unipolar bit-stream (0,1) by the comparator C (2), whose reference terminal is a ground, GND1. The unipolar signal u(t) is then low-pass filtered (LPF) (3) to produce a modulating signal m(t). The modulating signal m(t) is multiplied in (4) to produce a delta-sigma amplitude modulated signal Sam(t). This signal is delivered to both a transmission system (6) (which is a standard part, and it is not part of this invention), and an attenuator B (5) of a negative feedback of Δ-ΣM2. For clarity of the described process, let us write the general expression of the amplitude modulated signal [1].

$$s(t)=A_c[1+m(t)]\cos \omega_c t \qquad (1)$$

where [1+m(t)] is a DC shifted low-frequency modulating signal and $A_c \cos \omega_c t$ is a carrier signal. The AM waveforms and spectra of the signal (1) are shown in [1]. From FIG. 3 one can see that averaging (low-pass filtering) the unipolar signal u(t) a modulating signal m(t) is obtained. The signal m(t) is shifted for DC value of 0.5. Because the polar signal is a one-bit-stream representation of the input signal x(t) (unipolar as well), then after a proper averaging of a unipolar signal u(t) a shifted version of x(t) (signal m(t)) is obtained. FIG. 3 clearly illustrates this case. Multiplying the message signal [0.5+m(t)], shown in FIG. 3, with a density bit-stream of the carrier d(t) (which is a polar Δ-Σ bit-stream) one obtains an equation identical to equation (1).

$$\mathrm{Sam}(t)=[0.5+m(t)]*d(t) \qquad (2)$$

Figure 4:
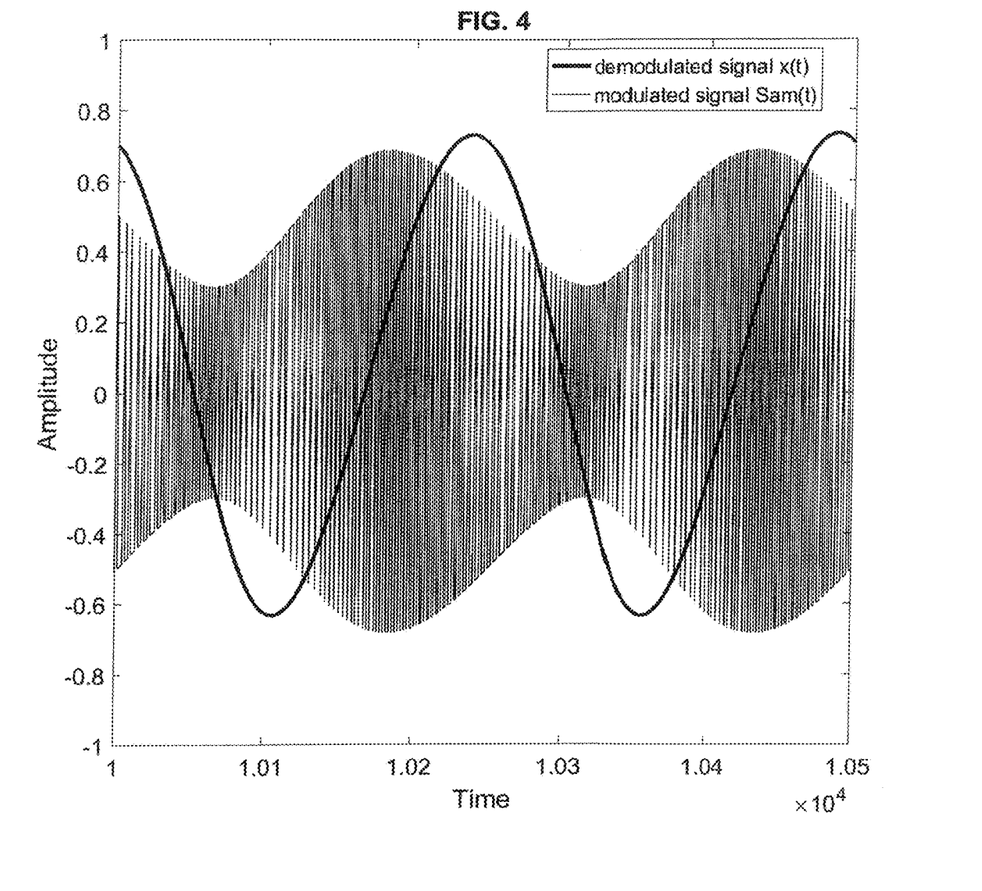
FIG. 4 shows a waveforms of AM signal Sam(t) and demodulated signal x(t).

FIG. 4 shows both the Δ-Σ AM waveform Sam(t) and the demodulated signal x(t). Demodulated signal, bold sinusoid in FIG. 4, is obtained when the transmitting signal Sam(t) is directly connected to the sign detector (8) (by-passing RF parts of transmitter and receiver). Thus, passing Sam(t) through sign detector circuit (8) only zero transitions of a carrier (Δ-Σ AM bit stream) are detected, and polar Δ-Σ bit stream is obtained. This Δ-Σ bit stream is low-pass filtered to obtain information signal x(t). Thus, instead of synchronous detection of an envelope, one can asynchronously detect a carrier of Sam(t) signal to obtain signal x(t).

Figure 12:
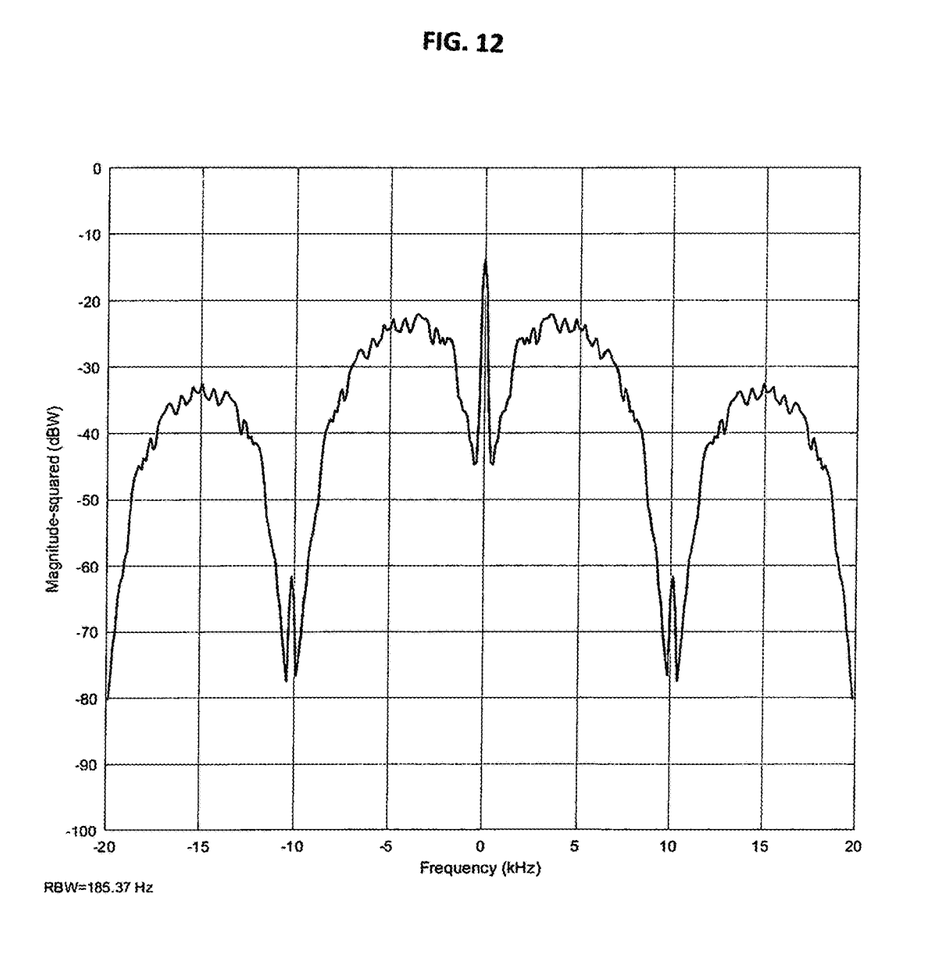
FIG. 12 shows a spectrum of a non-shaped carrier.

FIG. 12 shows the spectrum of the Sam(t) of equation (2) (Fourier transform).

In FIG. 2 a block diagram of a demodulator (receiver Rx) is shown as well. The operation of Rx is as follows. The AM signal Sam(t) is received by a low-noise radio frequency amplifier (7). The received signal is passed through a sign detector, zero-crossing comparator (8), to produce a polar signal +1, −1. Averaging this polar signal in (9) (low-pass filtering) one gets a demodulated signal x(t). FIG. 4 illustrates this case.

Figure 5:
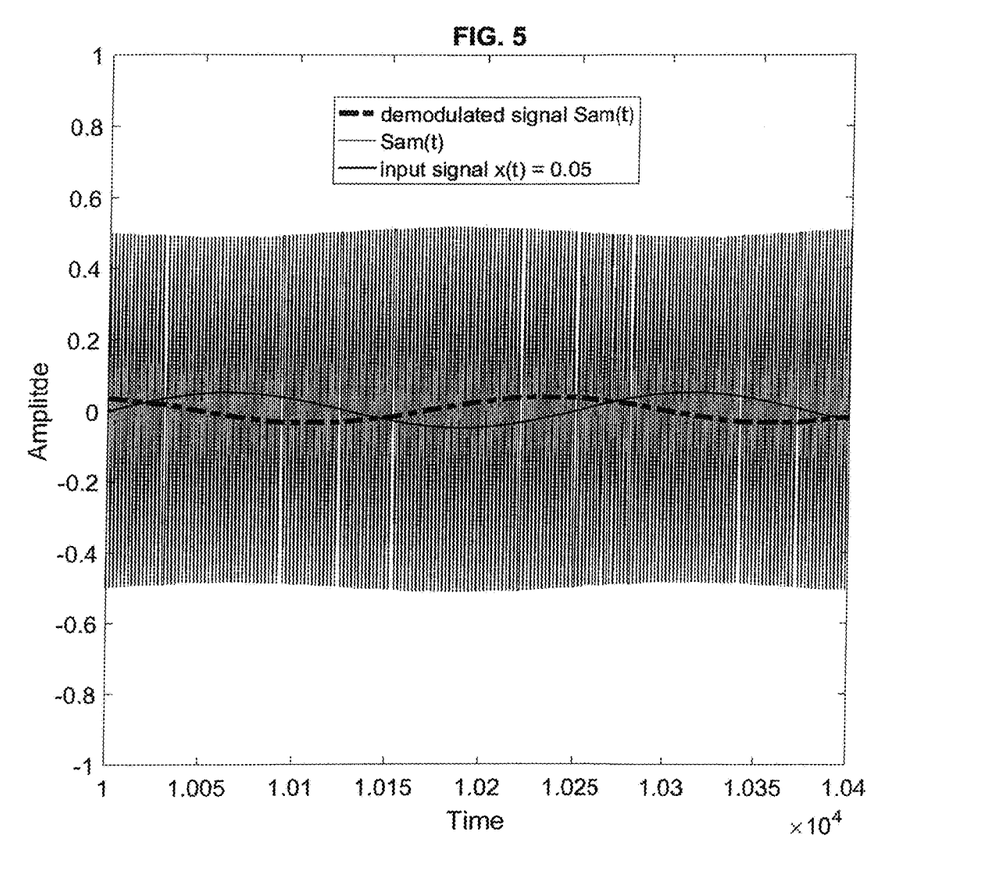
FIG. 5 shows a low-level input signal, AM signal, and demodulated signal.

FIG. 5 illustrates the case of modulation and demodulation for a very low input signal level. One can see correct operation of a proposed system.

Figure 6:
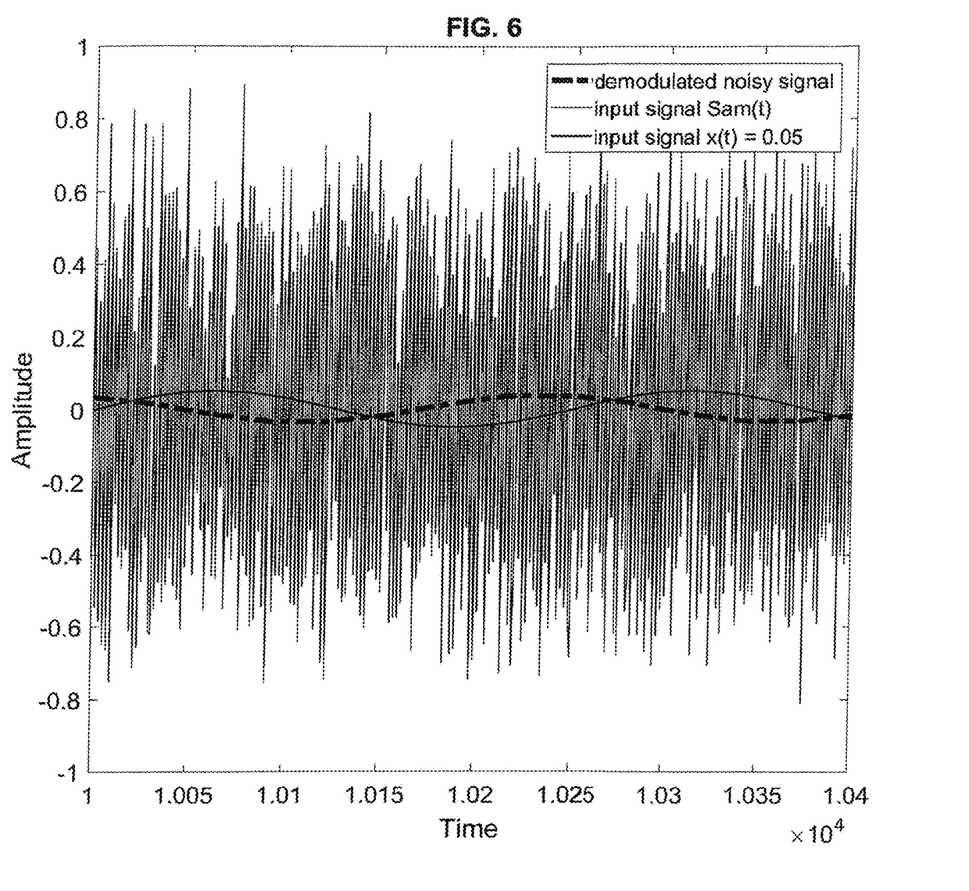
FIG. 6 shows a demodulated low-level signal in the presence of channel noise.

FIG. 6 illustrates a process of demodulation of low-level signal amplitude in the presence of additive white Gaussian noise (AWGN). One can see the correct demodulation because of superior robustness of a non-positional (non-weighted) Δ-Σ bit-stream.

Figure 7:
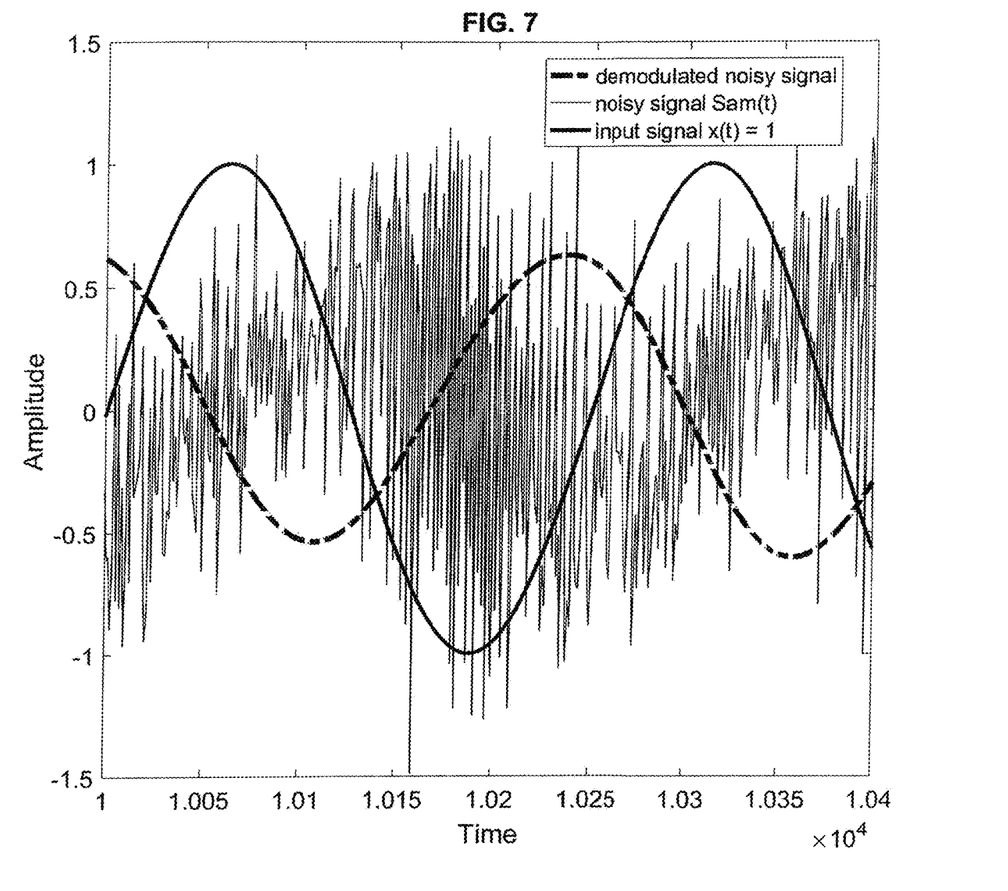
FIG. 7 shows a demodulation of a high-level signal in the presence of a channel noise.

FIG. 7 illustrates demodulation process in the presence of AWGN for high levels of input signal. Again, one can see correctly demodulated Sam(t) signal.

Figure 8:
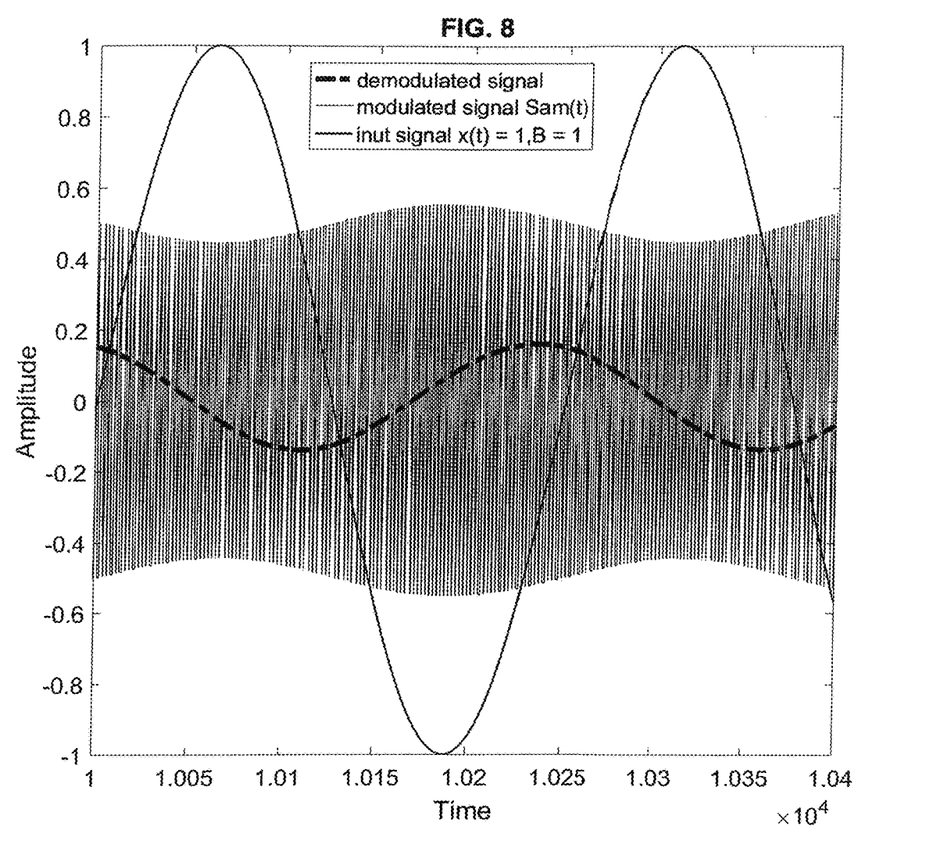
FIG. 8 shows a high-level input signal, AM signal, and demodulated signal when the feedback coefficient of a modulator is B=1.

FIG. 8 illustrates the case of demodulation where the index of AM modulation is regulated by the feedback attenuator/amplifier, B=1 (no attenuation of a feedback signal of modulator (1)).

Figure 9:
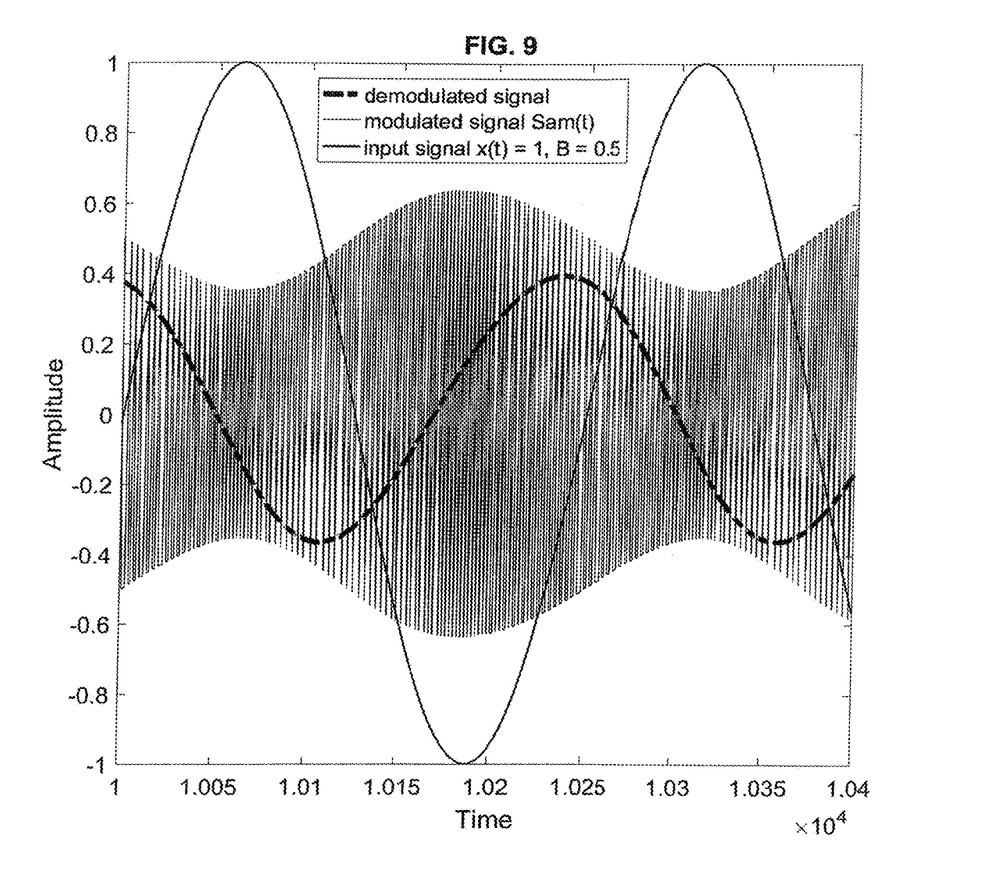
FIG. 9 shows a high-level input signal, AM signal, and a demodulated signal when a feedback coefficient of a modulator B=0.5.

FIG. 9 illustrates demodulation of the same input signal, x(t)=1, as in FIG. 8 with B=0.5. One can see a change in an envelope shape of Sam(t) signal (change of modulation index).

Figure 10:
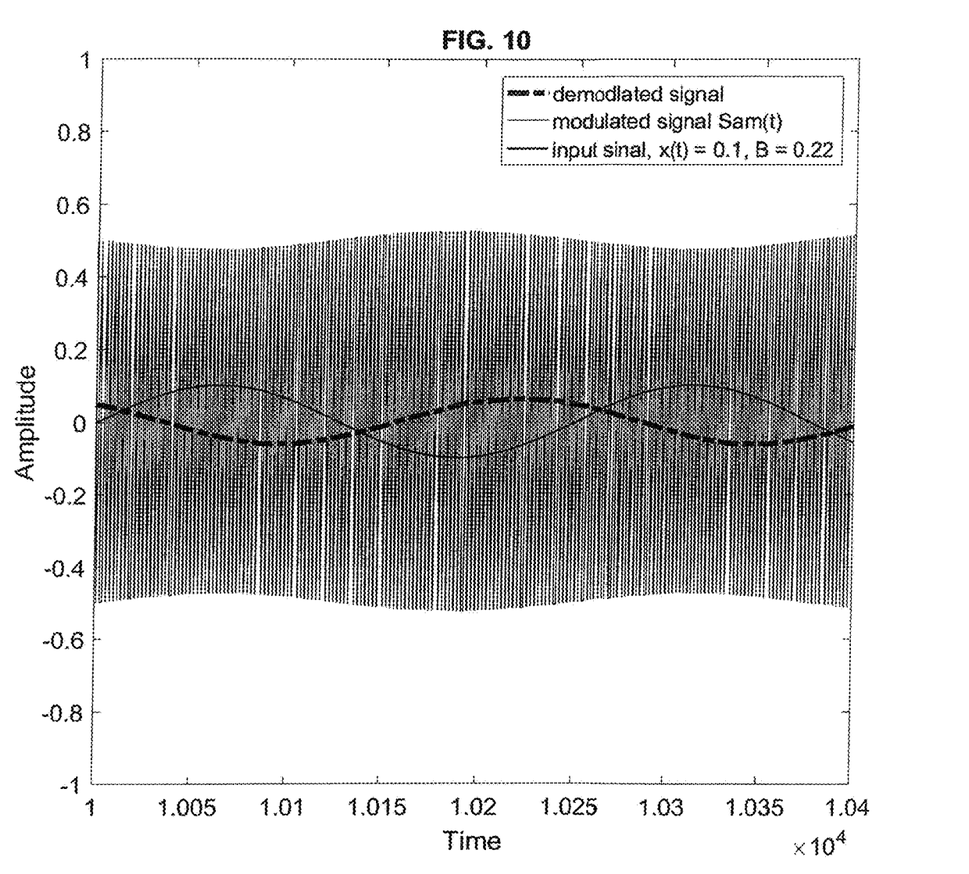
FIG. 10 shows a low-level input signal, AM signal, and demodulated signal when a feedback coefficient of a modulator is B=0.22.

By definition, index of amplitude modulation is expressed as AM_index=Am/Ac, where Am is amplitude of a modulating signal and Ac is amplitude of a carrier signal. FIG. 10 shows the waveforms when Am=0.5.

Figure 11:
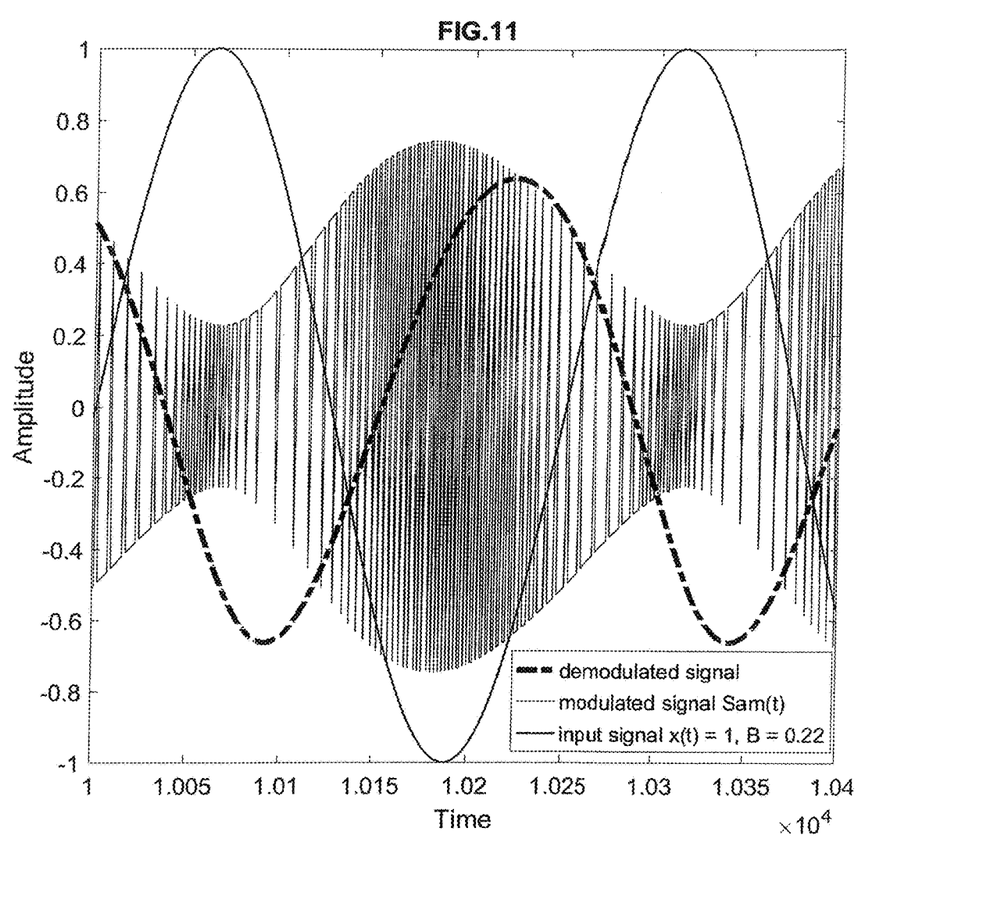
FIG. 11 shows a high-level input signal, AM signal, and demodulated signal when a feedback coefficient of a modulator is B=0.22.

FIG. 11 shows the case when Am=1. One can clearly see a change in Sam(t) waveform as result in of a Am/Ac ratio variation.

FIG. 12 shows the spectra of a Sam(t) waveform. Its shape is of sin x/x form. Depending on application, wide spectral bandwidth can interfere with neighboring channels. Thus, the bandwidth of Sam(t) signal must be limited. This can be achieved by reducing sampling frequency of a Δ-Σ modulator, or shaping carrier signal d(t), or both.

Figure 13:
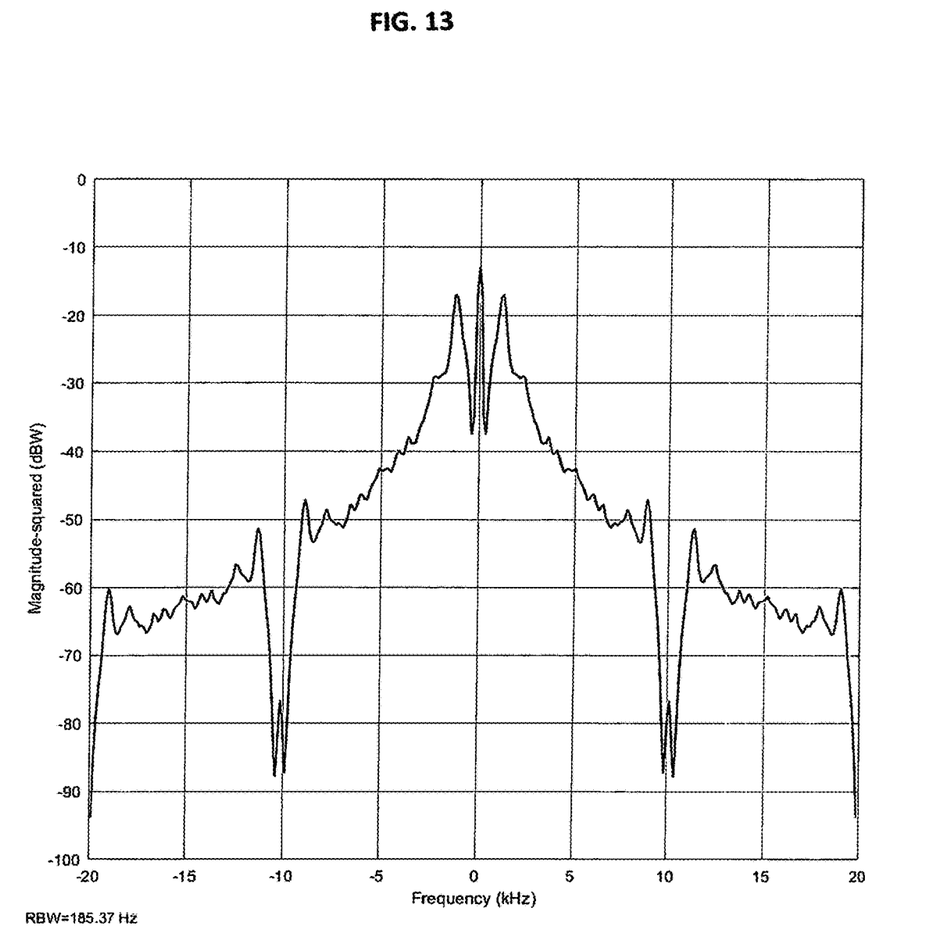
FIG. 13 shows a spectrum of a shaped carrier.

FIG. 13 shows the amplitude spectra when the carrier signal d(t) is slightly shaped with a low-pass filter. One can see significant reduction in a bandwidth for the same modulation index as in FIG. 12.

Figure 14:
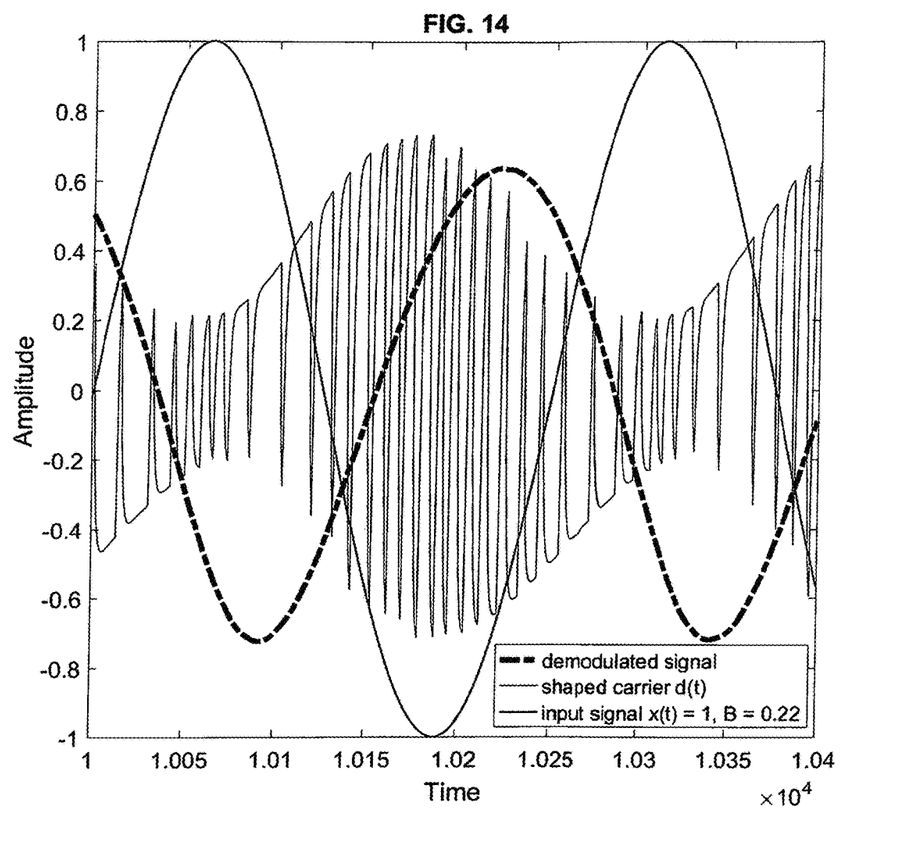
FIG. 14 shows a waveforms of input signal, modulated shaped carrier, and demodulated signal.

FIG. 14 shows a shaped carrier signal d(t), input and a demodulated output signal. One can see correct demodulation of a shaped Sam(t) waveform.

Figure 15:
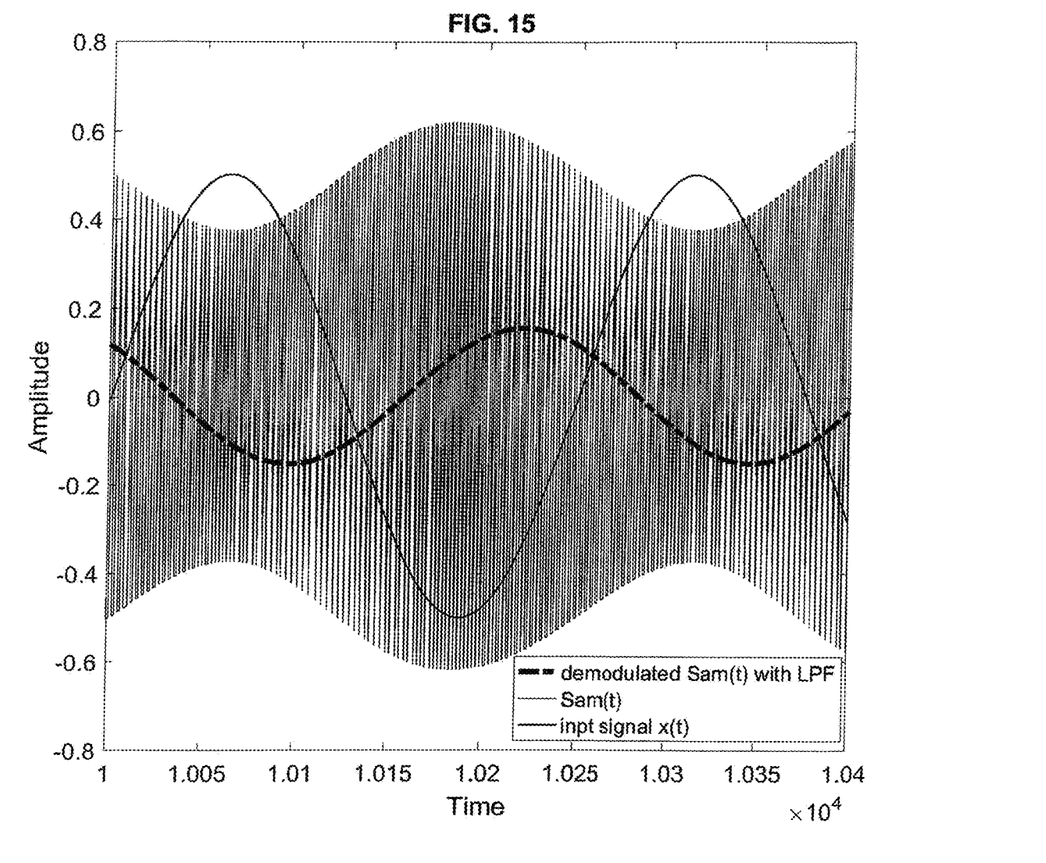
FIG. 15 shows a waveform when only LPF is used for demodulation of a high-level input signals.

FIG. 15 shows all relevant waveforms when the demodulator (Rx) is LPF only.

HOW TO USE THE INVENTION

The idea of using Δ-Σ modulator as a generator of an amplitude modulated signal is based on non-linear processing of a bit-stream in the feedback of the delta-sigma modulator. From the generated waveforms of this application one can see that a message (information) is contained in both the envelope and the bit-stream of a Δ-Σ modulator. Thus, demodulation can be achieved by a zero-crossing detector and low pass filter. Use of a low-pass filter is recommended for higher input levels of signal and a low level of channel noise. Some authors [4] consider the Δ-Σ modulator as a generator of a frequency modulated signal (pulse density is changing proportional to the input level). One can see from the generated AM waveforms for small input levels (Vin<0.3), and B=1, the amplitude of Sam(t) is almost constant. Thus, the bandwidth of Δ-Σ AM is almost the same as that of narrow-band frequency modulation (NBFM). Ideally, the FM waveform has a constant envelope. Practically, the envelope of FM contains a residual amplitude modulation that varies with time. One can see from FIG. 5 and FIG. 10 an insignificant envelope variation for small input amplitudes. The Δ-Σ AM can be used for speech transmission (Fmax=4 kHz) in applications involving ambulance communications, police wireless communications, taxi wireless communications, etc. With the current state of the CMOS technology oversampling factor (R=Fsamplin/Fin·max) of 1000 or more it should not be a problem [5]. The proposed system can operate in a licensed or un-licensed frequency bandwidth. Especially, the proposed system is suitable for modulation of low frequency sensor signals.

What is claimed is:

1. A delta-sigma amplitude modulation transmitter, comprising:
    a second order (or higher order) delta-sigma modulator to convert a low-frequency analog input signal x(t) into a one-bit polar stream (+1, −1);
    wherein a negative feedback of the modulator comprises:
    a comparator (with a threshold greater than or equal to zero) configured to convert the one-bit polar bit-stream (+1, −1) into a positive unipolar bit-stream u(t);
    a low-pass filter configured to receive the positive unipolar bit-stream u(t), and produce analog signal m(t);
    a multiplier configured to multiply the one-bit polar stream (+1, −1) with the analog signal m(t), and produce a delta-sigma amplitude modulated signal $S_{AM}(t)$;
    an attenuator B configured to regulate a level (index) of amplitude modulated signal $S_{AM}(t)$; and
    a radio frequency power amplifier, and an antenna.

* * * * *